(12) United States Patent
Lee et al.

(10) Patent No.: US 7,314,702 B2
(45) Date of Patent: Jan. 1, 2008

(54) COMPOSITION FOR A BOTTOM-LAYER RESIST

(75) Inventors: Sung-ho Lee, Gyeonggi-do (KR); Jin Hong, Gyeonggi-do (KR); Sang-gyun Woo, Yongin-si (KR)

(73) Assignee: Samsung Electronics Co., Ltd., Suwon, Kyungki-Do ( * ) Notice: Subject to any disclaimer, the term of this patent is extended or adjusted under 35 U.S.C. 154(b) by 374 days.

(21) Appl. No.: 10/726,477

(22) Filed: Dec. 3, 2003

(65) Prior Publication Data

US 2004/0146809 A1 Jul. 29, 2004

(30) Foreign Application Priority Data

Jan. 24, 2003 (KR) .................. 10-2003-0004805

(51) Int. Cl.
*G03F 7/00* (2006.01)
(52) U.S. Cl. .............. 430/270.1; 430/273.1; 430/286.1
(58) Field of Classification Search .......... 430/270.1, 430/273.1, 286.1
See application file for complete search history.

(56) References Cited

U.S. PATENT DOCUMENTS

| | | | | |
|---|---|---|---|---|
| 4,532,005 A | * | 7/1985 | Grieco et al. ............... 216/47 |
| 4,551,508 A | * | 11/1985 | Urasaki ..................... 525/507 |
| 5,290,882 A | * | 3/1994 | Shiobara et al. ............ 525/422 |
| 5,798,422 A | * | 8/1998 | Karasawa et al. ........... 525/450 |
| 5,932,389 A | * | 8/1999 | Zampini ..................... 430/192 |
| 6,127,087 A | * | 10/2000 | Kobayashi et al. .......... 430/191 |
| 6,207,789 B1 | * | 3/2001 | Sue et al. .................... 528/153 |
| 6,329,492 B1 | * | 12/2001 | Sue et al. .................... 528/97 |
| 6,384,103 B1 | * | 5/2002 | Arano et al. ................ 522/166 |
| 6,392,003 B1 | * | 5/2002 | Kiuchi et al. ............... 528/163 |
| 6,451,503 B1 | * | 9/2002 | Thackeray et al. ......... 430/271.1 |
| 6,472,128 B2 | * | 10/2002 | Thackeray et al. ......... 430/322 |
| 6,506,533 B1 | * | 1/2003 | Kottmair et al. ............ 430/190 |
| 6,713,589 B2 | * | 3/2004 | Sue et al. .................... 528/97 |
| 6,777,161 B2 | * | 8/2004 | Yasunami et al. ......... 430/270.1 |
| 2002/0119392 A1 | * | 8/2002 | Oda et al. ................ 430/270.1 |
| 2003/0129505 A1 | * | 7/2003 | Shiraishi et al. ............... 430/5 |
| 2003/0165779 A1 | * | 9/2003 | Kottmair et al. ............ 430/302 |
| 2004/0146800 A1 | * | 7/2004 | Watanabe et al. .......... 430/160 |
| 2004/0241577 A1 | * | 12/2004 | Hatakeyama et al. .... 430/270.1 |
| 2004/0259037 A1 | * | 12/2004 | Hatakeyama et al. ....... 430/312 |
| 2005/0008965 A1 | * | 1/2005 | Tao et al. ................ 430/270.1 |

FOREIGN PATENT DOCUMENTS

| | | | | |
|---|---|---|---|---|
| JP | 09127691 A | * | 5/1997 |
| JP | 11143067 A | * | 5/1999 |
| JP | 2002014474 A | * | 1/2002 |

OTHER PUBLICATIONS

English language abstract of JP 09-127691.*
Englush Language machine translation of JP 2002-14474.*

* cited by examiner

*Primary Examiner*—Amanda Walke
(74) *Attorney, Agent, or Firm*—F. Chau & Associates, LLC

(57) ABSTRACT

A composition for a bottom-layer resist, having superior anti-refractivity and dry-etch resistance for use in a bi-layer resist process employing a light source at a wavelength of 193 nm or below, is disclosed. The composition for the bottom-layer resist contains a polymer represented by formula 1:

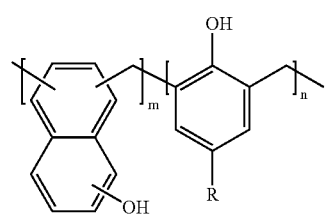

<Formula 1>

In formula 1, R is hydrogen or a methyl group, m/(m+n) is about 0.5 to about 1.0 and n/(m+n) is 0 to about 0.5.

10 Claims, 2 Drawing Sheets

COMPOSITION FOR A BOTTOM-LAYER RESIST

BACKGROUND

1. Technical Field

The present invention relates to a resist composition used in a photolithography process, and more particularly, to a resist composition for use as a bottom-layer resist used in a bi-layer resist process.

2. Discussion of the Related Art

As semiconductor devices become more highly integrated, the ability to form very fine patterns in a photolithography process becomes more important. For example, to fabricate semiconductor devices of a scale of one gigabit or greater, a pattern size having a design rule of 0.2 μm or less is needed. Further, light sources having a short wavelength, such as an ArF excimer laser ($\lambda$=193 nm) or a F2 ($\lambda$=157 nm) laser, have been proposed instead of a KrF excimer laser ($\lambda$=248 nm), which is a conventional light source of deep ultra violet (DUV) light.

Further, resist compositions for ArF or F2 light sources have suffered from a variety of drawbacks when used in a photolithography process in comparison with conventional resist compositions for the KrF or i-line ($\lambda$=365 nm) light sources. For example, the resist compositions have a weak resistance to a dry etching process and an increase in pattern collapse as an aspect ratio of pattern features increases. Thus, there is a need for new resist compositions and processes for using the same to prevent the above-identified problems.

Generally, in a photolithography process for the manufacture of highly integrated semiconductor devices, there are two types of processes widely used. One is a single-layer resist (SLR) process and another is a bi-layer resist (BLR) process. In a SLR process, a photoresist pattern is formed by patterning a photoresist layer using one photolithography process and a desired layer is directly patterned by using the patterned photoresist. In a BLR process, a bottom-layer resist and a top-layer photoresist are sequentially stacked. The top-layer photoresist is patterned by a photolithography process to form a top-layer photoresist pattern. The bottom-layer resist is patterned by using the top-layer photoresist pattern as a mask during an etching process, thereby forming a bottom-layer resist pattern. And then, a desired layer is patterned by using the bottom-layer resist pattern as a mask during an etching process. The top-layer photoresist in the BLR process is thinner than a photoresist layer in a SLR process. Thus, the top-layer photoresist pattern is not collapsed and is able to form finer patterns. The bottom-layer resist functions as an anti-refractive layer during the photolithography process with respect to the top-layer photoresist and functions as an etch mask while patterning a subsequent desired layer.

Further, in a BLR process using a light source having a wavelength of 248 nm, a novolak resin is usually employed as a bottom-layer resist. At a wavelength of 248 nm, the novolak resin has been well known to have superior anti-refractivity and dry-etch resistance while patterning a layer formed of an inorganic material. However, the novolak resin has a high refractivity of greater than 10% at a wavelength of 193 nm or below, thereby being incongruent as a bottom-layer resist when used in conjunction with a wavelength of 193 nm or below.

Therefore, a need exists for a resist composition to be used as a bottom-layer resist in a bi-layer resist process that provides an increase in resistance to a dry-etching process and a decrease in pattern collapse as an aspect ratio increases as pattern features of a device also increase. Further, there is also a need for a resist composition to be used as a bottom-layer resist in a BLR process using a photolithography process employing a light source having a wavelength region of 193 nm or below while improving a dry-etch resistance and decreasing pattern collapse of a resist composition.

SUMMARY OF THE INVENTION

An aspect of the present invention provides a new composition for a bottom-layer resist that has a superior anti-refractivity and dry-etch resistance in a bi-layer resist process employing a light source having a wavelength of 193 nm or below.

Accordingly, to achieve the above aspect and other aspects of the present invention, there is provided a composition for use as a bottom-layer resist including a polymer comprising hydroxynaphthalene and hydroxybenzene, as represented by the following formula 1:

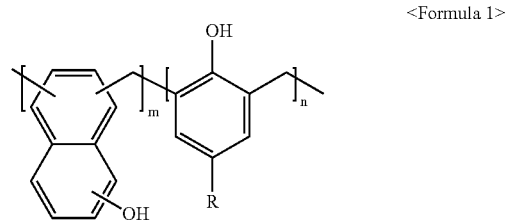

<Formula 1>

In formula 1, R is hydrogen or a methyl group. m/(m+n) is about 0.5 to about 1.0 and n/(m+n) is 0 to about 0.5.

The composition for the bottom-layer resist may further include a cross-linker represented by the following formula 2:

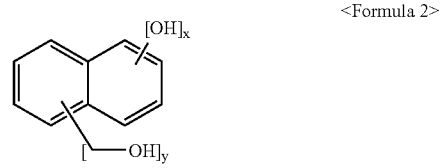

<Formula 2>

In formula 2, x is an integer in the range of 1 to 3, and y is an integer in the range of 2 to 4. In the composition of the bottom-layer resist, the cross-linker is preferably about 10 to about 40 wt. % based upon the total weight of the polymer.

In formula 1, the hydroxynaphthalene may be 1-hydroxynaphthalene or 2-hydroxynaphthalene depending on the position of the hydroxy group (—OH). In addition, the hydroxybenzene may be phenol or cresol depending on whether R is a hydrogen or a methyl group, respectively. A naphthalene compound, such as the hydroxynaphthalene, includes a structure having a combination of two benzene rings, thereby forming a compound having a superior dry-etch resistance and a superior anti-refractivity at a wavelength of 193 nm or below in comparison with a conventional novolak resin having a phenol structure. Also, the refractivity may be controlled by controlling the percentages of hydroxynaphthalene and hydroxybenzene used in polymerization of formula 1. Preferably, m/(m+n) is about 0.5 to about 1.0 and n/(m+n) is about 0 to about 0.5. The cross-linker represented by formula 2 used as a cross-linker for the polymer, represented by formula 1, also prevents the bottom-layer resist and the top-layer photoresist from being mixed at an interface therebetween.

The composition for the bottom-layer resist may further include a thermal acid generator (TAG). Preferably, the TAG is about 1 to about 15 wt. % based on the total weight of the polymer. In addition, the TAG is selected from a group consisting of compounds of aromatic sulfonic acid salts. Preferably, the TAG is ammonium toluene sulfonate.

The composition for the bottom-layer resist may further include a photo acid generator (PAG). Preferably, the PAG is about 0.1 to about 5 wt. % based upon the total weight of the polymer. In addition, the PAG is a compound selected from a group consisting of triarylsulfonium salts, diaryliodonium salts, and sulfonate.

DETAILED DESCRIPTION OF PREFERRED EMBODIMENTS

Figure 1:
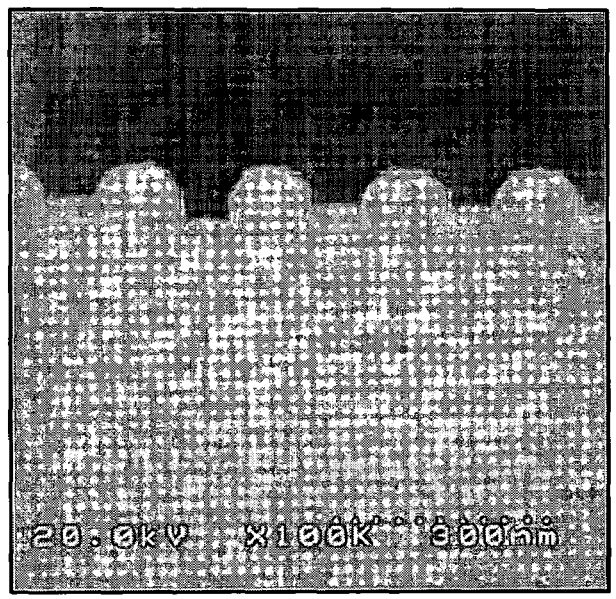
FIG. 1 is a cross-sectional view of the top-layer photoresist pattern, according to an exemplary embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the present invention provides a photosensitive polymer comprising hydroxynaphthalene and hydroxybenzene represented by the following formula 1:

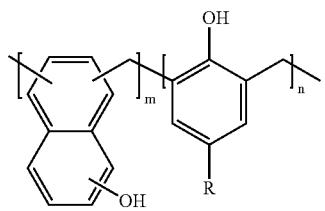

<Formula 1>

In formula 1, R is hydrogen or a methyl group. m/(m+n) is about 0.5 to about 1.0 and n/(m+n) is 0 to about 0.5.

<Synthesis 1 of a Photosensitive Polymer Represented by Formula 1>

14.4 g of 1-hydroxynaphthalene (0.1 mol), 10.8 g of cresol (0.1 mol) and 6 g of paraformaldehyde (0.2 mol) were mixed together in a flask. The mixture was then heated to a temperature of about 250° C. and reacted for about 10 hours. After the reaction, the flask was then cooled to an ambient temperature. After cooling, the flask was connected to a vacuum distillation device and the product and remaining reactants were heated to about 150° C. under vacuum, thereby removing unreacted monomers from the flask. The product remaining in the flask was then dissolved in a methanol solution. Next, the product was precipitated in a solution comprising about 80% water and about 20% ethanol. Then, the precipitate was filtered and re-dissolved in a methanol solution. Thereafter, the product was purified and re-precipitated in a solution comprising about 80% water and about 20% ethanol. Next, the obtained precipitate was dried in a vacuum oven at a temperature of about 40° C. for about 48 hours, thereby giving a desired product at a yield of about 53%. The desired product was a polymer represented by formula 1.

In another aspect, the present invention provides a cross-linker represented by the following formula 2:

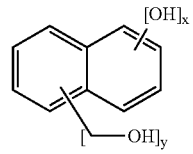

<Formula 2>

In formula 2, x is an integer in the range of 1 to 3, and y is an integer in the range of 2 to 4. In the composition of the bottom-layer resist, the cross-linker is preferably about 10 to about 40 wt. % based upon the total weight of the polymer.

<Synthesis 2 of the Cross-linker Represented by Formula 2>

In a flask, 14.4 g of 2,4-dihydroxyhaphthalene (0.1 mol) and 18 g of paraformaldehyde (0.6 mol) were dissolved in 50 ml of toluene. Next, the mixture was heated to a temperature of about 250° C. and reacted for about 20 hours. After the reaction, the flask was cooled to an ambient temperature. The flask was then connected to a vacuum distillation device and heated to about 150° C. under vacuum, thereby removing unreacted monomers from the flask. The product remaining in the flask was recrystallized and purified using a cyclohexane solution, to then separate desired product (yield: 35%). The desired product was a cross-linker represented by formula 2, as shown above.

Embodiment 1

5.0 g of the polymer formed by synthesis 1 and 0.15 g of the cross-linker 0.15 g formed by synthesis 2 were mixed and dissolved in 30.3 g of ethyl lactate 30.3 g, which is a solvent, together with 0.1 g of ammonium toluene sulfonate, which is a TAG. The solution was then filtered through a 0.2 μm membrane filter, thereby obtaining a composition for a bottom-layer resist.

Embodiment 2

Figure 2:
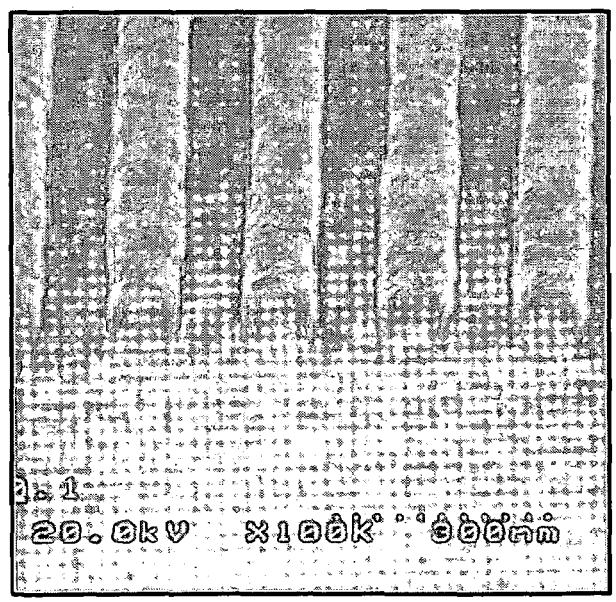
FIG. 2 is a top view of the top-layer photoresist pattern, according to another exemplary embodiment of the present invention.

A semiconductor substrate was coated with the composition for a bottom-layer resist, synthesized in the embodiment 1, to a thickness of about 4000 Å. The semiconductor substrate with the composition was baked at a temperature of about 270° C. for about 90 seconds to form a bottom-layer resist. A top-layer photoresist containing silicon having a thickness of about 1500 Å was then coated on the bottom-layer resist on the semiconductor substrate. Next, the semiconductor substrate was pre-baked at a temperature of about 120° C. for about 90 seconds and exposed to light source using an ArF excimer laser (NA 0.75). A post-exposure bake process was then performed at a temperature of about 120° C. for about 90 seconds followed by a development process using a solution of 2.38 wt % of tetramethylammonium hydroxide (TMAH) for about 60 seconds, thereby forming a top-layer photoresist pattern of about 0.10 to about 0.30 μm line/space (L/S) with a thickness of about 1200 Å at a dose of 15 mJ/cm². FIG. 1 is a cross-sectional view of a top-layer photoresist pattern formed according to the present embodiment, and FIG. 2 is a top view thereof. As shown in FIGS. 1 and 2, the top-layer photoresist pattern was clearly formed.

Embodiment 3

Figure 3:
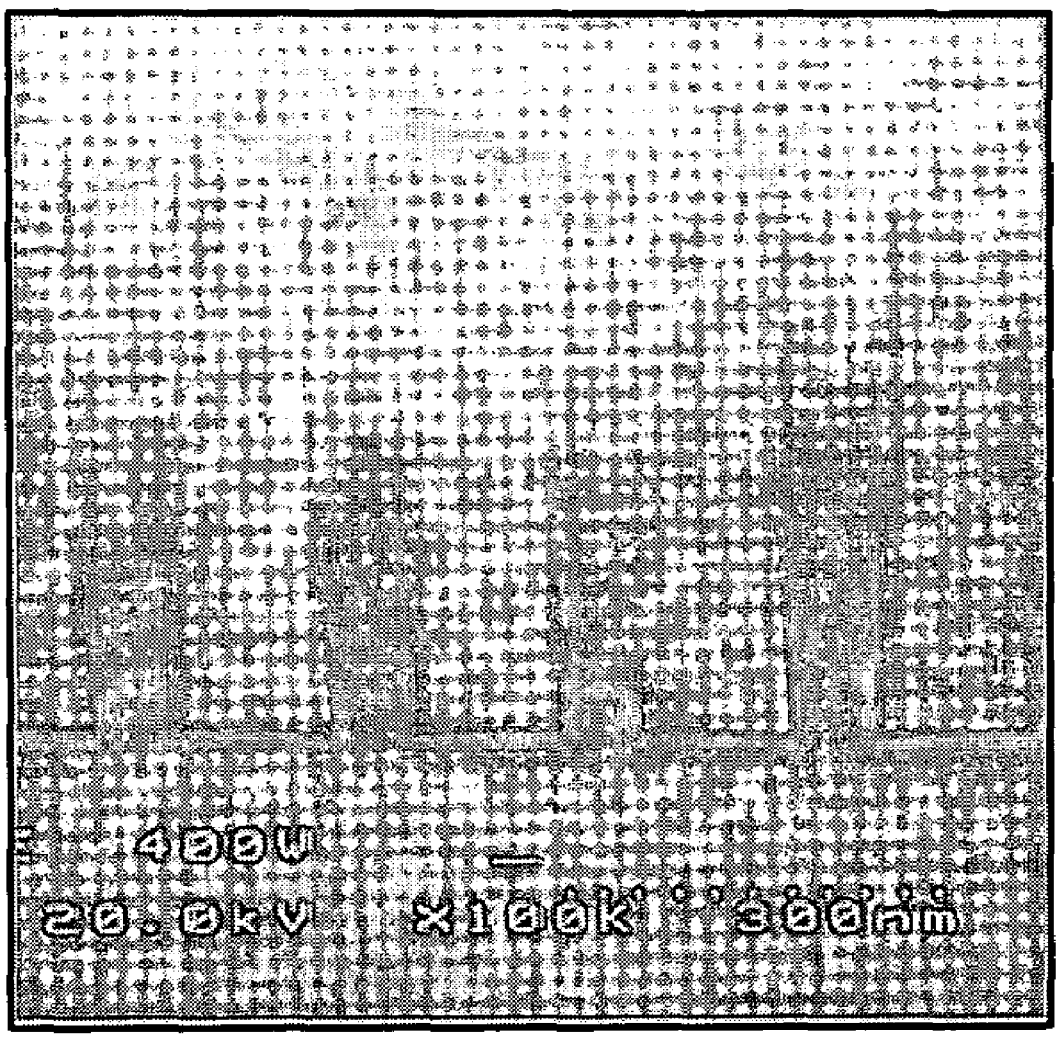
FIG. 3 is a photograph showing a bottom-layer resist pattern and remaining top-layer photoresist pattern, according to yet another exemplary embodiment of the present invention.

A wafer having a bottom-layer resist and a top-layer photoresist pattern on the bottom-layer resist, wherein the bottom-layer resist has been formed according to embodiment 2, was dry-etched for about 90 seconds by supplying oxygen and sulfur dioxide into an etching chamber, thereby forming a bottom-layer resist pattern. The size of the bottom-layer resist pattern was substantially the same as the top-layer photoresist pattern, i.e., about 0.10 to about 0.30 μm L/S. In addition, the thickness of the bottom-layer resist pattern was substantially the same as the bottom-layer resist formed in the embodiment 2. And, the top-layer photoresist pattern remained thereon having a thickness of about 500 to about 700 Å. FIG. 3 is a photograph showing the bottom-layer resist pattern and remaining top-layer photoresist pattern that were formed according to the present embodiment. As seen in FIG. 3, the bottom-layer resist pattern was formed without any collapse.

Embodiment 4

A wafer having a bottom-layer resist and a top-layer photoresist pattern on the bottom-layer resist, wherein the bottom-layer was formed according embodiment 2, was dry-etched for about 90 seconds by supplying oxygen and nitrogen into an etching chamber, thereby forming a bottom-layer resist pattern. The size of the bottom-layer resist pattern was greater than the top-layer photoresist pattern by about 10 nm. The thickness of the bottom-layer resist pattern was substantially the same as of the bottom-layer resist formed in the embodiment 2, i.e., about 4000 Å. And, the top-layer photoresist pattern remained thereon having a thickness of about 200 to about 500 Å.

Accordingly, since the polymer contained in the composition for a bottom-layer resist has hydroxybenzene and hydroxynaphthalene having two benzene rings, the composition for the bottom-layer resist of the present invention provides a resist composition having a superior dry-etch resistance and a superior anti-refractivity at a wavelength of 193 nm or below.

While the invention has been particularly shown and described with reference to preferred embodiments thereof, the invention is not limited thereto, and it will be understood by those skilled in the art that various modifications and alterations may be made without departing from the spirit and scope of the invention.

What is claimed is:

1. A composition for a bottom-layer resist, comprising a polymer represented by the following formula:

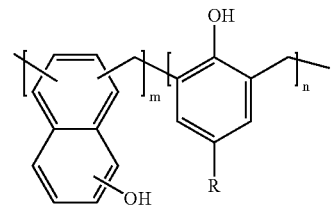

wherein R is hydrogen or a methyl group, m/(m+n) is about 0.5 to about 1.0 and n/(m+n) is greater than 0 but less than or equal to 0.5;
a thermal acid generator (TAG); and a cross-linker.

2. The composition as claimed in claim 1, wherein the cross-linker is represented by the following formula:

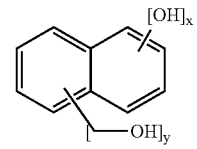

wherein x is an integer in the range of 1 to 3, and y is an integer in the range of 2 to 4.

3. The composition as claimed in claim 2, wherein the cross-linker comprises about 10 to about 40 wt. % based upon the total weight of the polymer.

4. The composition as claimed in claim 1, wherein the TAG is about 1 to about 15 wt. % based on the total weight of the polymer.

5. The composition as claimed in claim 4, wherein the TAG is a compound selected from a group consisting of aromatic sulfonic acid salts.

6. The composition as claimed in claim 4, wherein the TAG is ammonium toluene sulfonate.

7. A patterning method for a semiconductor device comprising:
(a) forming a first resist layer by coating a resist composition on a layer to be etched on a semiconductor substrate, wherein the resist composition is represented by the following formula:

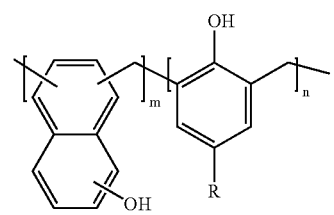

wherein R is hydrogen or a methyl group, m/(m+n) is about 0.5 to about 1.0 and n/(m+n) is 0 to about 0.5, and wherein the resist composition further includes a thermal acid generator (TAG), and a crosslinker agent represented by the following

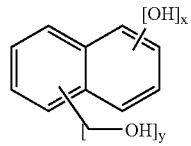

wherein x is an integer in the range of 1 to 3, and y is an integer in the range of 2 to 4;
(b) baking the first resist layer, thereby forming a bottom resist layer;
(c) forming a second resist layer containing silicon on the bottom resist layer;
(d) pre-baking the second resist layer;
(e) exposing the second resist layer to light;
(f) performing a post-exposure baking (PEB) on the second resist layer;
(g) forming a top layer resist pattern by developing the exposed second resist layer;
(h) forming a bottom resist layer pattern by etching the bottom resist layer using the top layer resist pattern as an etching mask; and
(i) etching the layer to be etched using the bottom resist layer pattern as an etching mask.

8. The patterning method of claim 7, wherein in step (e), ArF or $F_2$ eximer laser is used for the exposing.

9. The patterning method of claim 7, wherein the TAG is a compound selected from a group consisting of aromatic sulfonic acid salts.

10. The patterning method of claim 7, wherein the TAG is ammonium toluene sulfonate.

* * * * *